(12) United States Patent
Kondo et al.

(10) Patent No.: US 8,132,161 B2
(45) Date of Patent: Mar. 6, 2012

(54) SEMICONDUCTOR TEST PROGRAM DEBUG DEVICE

(75) Inventors: Shigeru Kondo, Tokyo (JP); Hidekazu Kitazawa, Tokyo (JP); Toshihisa Kumagai, Tokyo (JP)

(73) Assignee: Advantest Corporation, Tokyo (JP)

( * ) Notice: Subject to any disclaimer, the term of this patent is extended or adjusted under 35 U.S.C. 154(b) by 1123 days.

(21) Appl. No.: 11/913,676

(22) PCT Filed: May 10, 2006

(86) PCT No.: PCT/JP2006/309385
§ 371 (c)(1),
(2), (4) Date: Nov. 5, 2007

(87) PCT Pub. No.: WO2006/123560
PCT Pub. Date: Nov. 23, 2006

(65) Prior Publication Data
US 2009/0055803 A1    Feb. 26, 2009

(30) Foreign Application Priority Data
May 20, 2005    (JP) .................................. 2005-147457

(51) Int. Cl.
*G06F 9/44* (2006.01)
*G06F 9/45* (2006.01)
*G06F 11/00* (2006.01)
*G01D 3/00* (2006.01)

(52) U.S. Cl. ........ 717/134; 717/124; 717/140; 702/108; 714/742

(58) Field of Classification Search ........................ None
See application file for complete search history.

(56) References Cited

U.S. PATENT DOCUMENTS 4,903,199 A * 2/1990 Keenan et al. ................ 717/134
6,725,432 B2 * 4/2004 Chang et al. .................. 716/132
(Continued)

FOREIGN PATENT DOCUMENTS

JP    7-319950    12/1995
JP    2001-51025   2/2001

OTHER PUBLICATIONS

Rajsuman et al., "Architecture, Design, and Application of an Event-Based Test System", 2003 IEEE, pp. 1408-1427 < http://ieeexplore.ieee.org/stamp/stamp.jsp?arnumber=01240154>.*

(Continued)

*Primary Examiner* — Thuy Dao
*Assistant Examiner* — Ben Wang
(74) *Attorney, Agent, or Firm* — patenttm.us

(57) ABSTRACT

It is possible to provide a semiconductor test program debug device capable of reducing the unnecessary facilities when using a semiconductor test device or a semiconductor test program of different specification. The semiconductor test program debug device 300 includes a virtual device 80 for simulating operation of the device under test, a dedicated test bench processing section 60 and a general-purpose test bench processing section 70 for generating a pseudo test signal and a response signal inputted/outputted between to/from the virtual device 80, conversion source program storage sections 10-14 for storing a plurality of semiconductor test programs of different specifications, dedicated conversion rule storage sections 30, 32 and general-purpose conversion rule storage sections 40, 42 for storing conversion rules corresponding to the respective specifications, and conversion processing sections 20-26 for generating the dedicated and the general-purpose bench processing sections 60, 70 by using the semiconductor test programs stored in the conversion source program storage sections 10-14.

8 Claims, 2 Drawing Sheets

U.S. PATENT DOCUMENTS

| | | | | |
|---|---|---|---|---|
| 6,725,449 | B1 * | 4/2004 | Maeda et al. | 717/124 |
| 6,968,514 | B2 * | 11/2005 | Cooke et al. | 716/102 |
| 7,197,417 | B2 * | 3/2007 | Pramanick et al. | 717/124 |
| 7,209,851 | B2 * | 4/2007 | Singh et al. | 717/124 |
| 2001/0037282 | A1 * | 11/2001 | Yoneda | 705/37 |
| 2004/0225459 | A1 * | 11/2004 | Krishnaswamy et al. | 702/57 |
| 2005/0022086 | A1 * | 1/2005 | Kotz et al. | 714/742 |
| 2005/0022087 | A1 * | 1/2005 | Pramanick et al. | 714/742 |
| 2005/0154550 | A1 * | 7/2005 | Singh et al. | 702/108 |
| 2005/0207252 | A1 * | 9/2005 | Takahashi et al. | 365/222 |
| 2005/0283697 | A1 * | 12/2005 | Kang et al. | 714/742 |
| 2006/0061379 | A1 * | 3/2006 | Izuru et al. | 324/765 |
| 2008/0040639 | A1 * | 2/2008 | Kang | 714/738 |
| 2009/0055803 | A1 * | 2/2009 | Kondo et al. | 717/134 |
| 2010/0192135 | A1 * | 7/2010 | Krishnaswamy et al. | 717/140 |

FOREIGN PATENT DOCUMENTS

OTHER PUBLICATIONS

Hogan et al., "Virtual test reduces semiconductor product development time", Apr. 2001, Electronics & Communication Engineering Journal, pp. 77-83 < http://ieeexplore.ieee.org/stamp/stamp.jsp?arnumber=00920679>.*

Nimmer et al., "Automatic Generation of Program Specifications", 2002 ACM, pp. 229-239 <http://dl.acm.org/results.cfm?h=1&cfid=77816848&cftoken=22113461>.*

Bart Vermeulen, "Design-for-Debug to Address Next-Generation SoC Debug Concerns", 2007 IEEE, International Test Conference, pp. 1-1 < http://ieeexplore.ieee.org/stamp/stamp.jsp?tp=&arnumber=4437683>.*

* cited by examiner

SEMICONDUCTOR TEST PROGRAM DEBUG DEVICE

This application is a national phase entry of and claims benefit of PCT/JP2006/309385 filed May 10, 2006.

TECHNICAL FIELD

The present invention relates to a semiconductor test program debug device that emulates the operation of a semiconductor test device to perform verification of a semiconductor test program.

BACKGROUND ART

A semiconductor test device is already known that performs a functional test or a direct current test or the like on various kinds of semiconductor devices such as a logic IC (integrated circuit) or a semiconductor memory before shipment. In the case of executing a functional test or a direct current test or the like using a semiconductor test device, various conditions with respect to which items to test under which conditions are previously incorporated into a semiconductor test program, and therefore various kinds of tests can be performed on the semiconductor device under test by executing the semiconductor test program. However, the semiconductor test program must control a wide range of operations such as setting test items, setting test conditions executing the test, determining test results and the like. Consequently, the semiconductor test program consists of a vast amount of steps. When the kind of semiconductor device to be tested changes or the logic thereof changes, the semiconductor test program must also undergo various changes in accordance with those changes. When a semiconductor test program is newly created or changed, the program must be assessed to determine whether or not the program itself operates normally. One method of assessing the semiconductor test program in such a case is to operate the program with respect to a semiconductor device under test for which it is already known whether the device should pass or fail using an actual semiconductor test device. However, a semiconductor test device is itself expensive and the number of devices that have been introduced is small. Therefore, assessing whether or not a semiconductor test program operates normally using an actual semiconductor test device is not preferable since it involves stopping the semiconductor test line. Therefore, conventionally a semiconductor test program is not assessed using an actual semiconductor test device. Instead, the operations of a semiconductor test device are emulated using a general-purpose computer such as a workstation, and a semiconductor test program debug device has been used that performs debugging with respect to whether or not the semiconductor test program operates normally (for example, see Patent Document 1).

Patent Document 1: Japanese Patent Laid-Open No. 2001-51025 (pages 3 to 5, FIGS. 1 to 3).

DISCLOSURE OF THE INVENTION

The semiconductor test program debug device disclosed in Patent Document 1 (hereunder, referred to simply as "debug device") is made to specifications that are suited to the semiconductor test program that is the debugging object. For example, in a case in which company A and company B are manufacturers of semiconductor test devices, a debug device WA is made so as to emulate the operations of a semiconductor test device TA that is manufactured by company A when a semiconductor test program-a that is incorporated in the semiconductor test device TA is executed. Further, a debug device WB is necessary in order to emulate the operations of a semiconductor test device TB that is manufactured by company B when a semiconductor test program-b that is incorporated in the semiconductor test device TB is executed. There is thus a problem that, when debugging a semiconductor test program to be used in a plurality of semiconductor test devices that are made by different manufacturers, a debug device with different specifications is necessary for each manufacturer, which results in a large waste of facilities. This problem can also arise with respect to a plurality of semiconductor test devices that are introduced from the same manufacturer. For example, in a case in which the specifications of a semiconductor test program differ significantly depending on the purchase period, since it is not possible to debug semiconductor test programs that have different specifications using a common debug device, a plurality of debug devices that are compatible with the respective specifications of the semiconductor test programs are required.

The present invention was made in consideration of the above problems. An object of the present invention is to provide a semiconductor test program debug device capable of reducing the unnecessary facilities when using semiconductor test devices or semiconductor test programs that have different specifications.

In order to solve the above described problems, a semiconductor test program debug device according to the present invention performs verification of a semiconductor test program by emulating operations of a semiconductor test device that conducts a test with respect to a device under test based on the semiconductor test program, and comprises a virtual device that simulates the operations of the device under test; a test bench processing unit that generates a pseudo test signal corresponding to a test signal that is applied to the device under test and also generates a response signal of the virtual device that corresponds to the pseudo test signal; a conversion source program storage unit that stores each of a plurality of the semiconductor test programs that have different specifications; a conversion rule storage unit that stores conversion rules corresponding to each of the plurality of specifications; and a conversion processing unit that, by converting the semiconductor test program that is stored in the conversion source program storage unit using the conversion rule corresponding to specifications of the semiconductor test program that is stored in the conversion rule storage unit, generates the test bench processing unit that corresponds to the semiconductor test program. As a result, even in a case in which there are a plurality of semiconductor test devices or semiconductor test programs that have different specifications, a virtual test (input and output operations for pseudo test signals and response signals) can be executed with respect to a virtual device in accordance with the respective specifications, and because it is not necessary to provide a semiconductor test program debug device for each specification, unnecessary facilities can be reduced.

Preferably, the above described semiconductor test program is a pattern program that specifies a generation pattern for a test signal to be applied to the device under test. Thereby, when a plurality of specifications for pattern programs exist, debugging (verification) of the pattern programs can be performed with a common program debug device for a semiconductor test device.

Further, the above described virtual device and test bench processing unit are preferably implemented by the same hardware description language. More specifically, Verilog-HDL (HDL (Hardware Description Language)) or VHDL (VHSIC (Very High Speed Integrated Circuits) Hardware Description Language) is preferably used for the aforementioned hardware description language. It is thereby possible to implement the functions of the test bench processing unit together with a virtual device using Verilog-HDL or VHDL as the hardware description language. In particular, although there are many cases in which a semiconductor test program has specifications that are unique to the manufacturer of a semiconductor test device, since it is possible to convert the semiconductor test program into a test bench processing unit using a general-purpose hardware description language, a semiconductor test program debug device with improved versatility and flexibility can be realized.

Furthermore, when there are a plurality of semiconductor test devices that are manufactured by different manufacturers and a plurality of semiconductor test programs corresponding to the respective semiconductor test devices, preferably a plurality of specifications have contents that are set for each manufacturer. It is thereby possible to perform debugging of a plurality of semiconductor test programs of different specifications for each manufacturer using a common semiconductor test program debug device.

In particular, preferably the conversion rules that are stored in the aforementioned conversion rule storage unit and the conversion processing unit are created by manufacturers in correspondence with their respective specifications. It is thereby possible to create a general-purpose test bench unit that operates with a common semiconductor test program debug device without disclosing detailed internal material of respective manufacturers with respect to each manufacturer of competing semiconductor test devices, and to facilitate the common use of the semiconductor test program debug device.

Further, when there are a plurality of semiconductor test devices of different model numbers or versions that are manufactured by the same manufacturer and a plurality of semiconductor test programs corresponding to the respective semiconductor test devices, it is preferable that a plurality of specifications have contents that are set for each model number or version. It is thereby possible to perform debugging of a plurality of semiconductor test programs of different model numbers or versions within the manufacturer with a common semiconductor test program debug device.

It is also preferable that, when the test bench processing unit is specified based on the conversion rule, the aforementioned conversion processing unit performs inverse conversion that generates a corresponding semiconductor test program. As a result, reciprocal conversion of semiconductor test programs of different specifications can be carried out through a test bench processing unit that is created temporarily, specifications of semiconductor test programs of respectively different manufacturers or model numbers or versions or the like can be automatically changed, and in addition to effective utilization of semiconductor test programs, errors in specification changes due to manual operations can be prevented.

Figure 1:
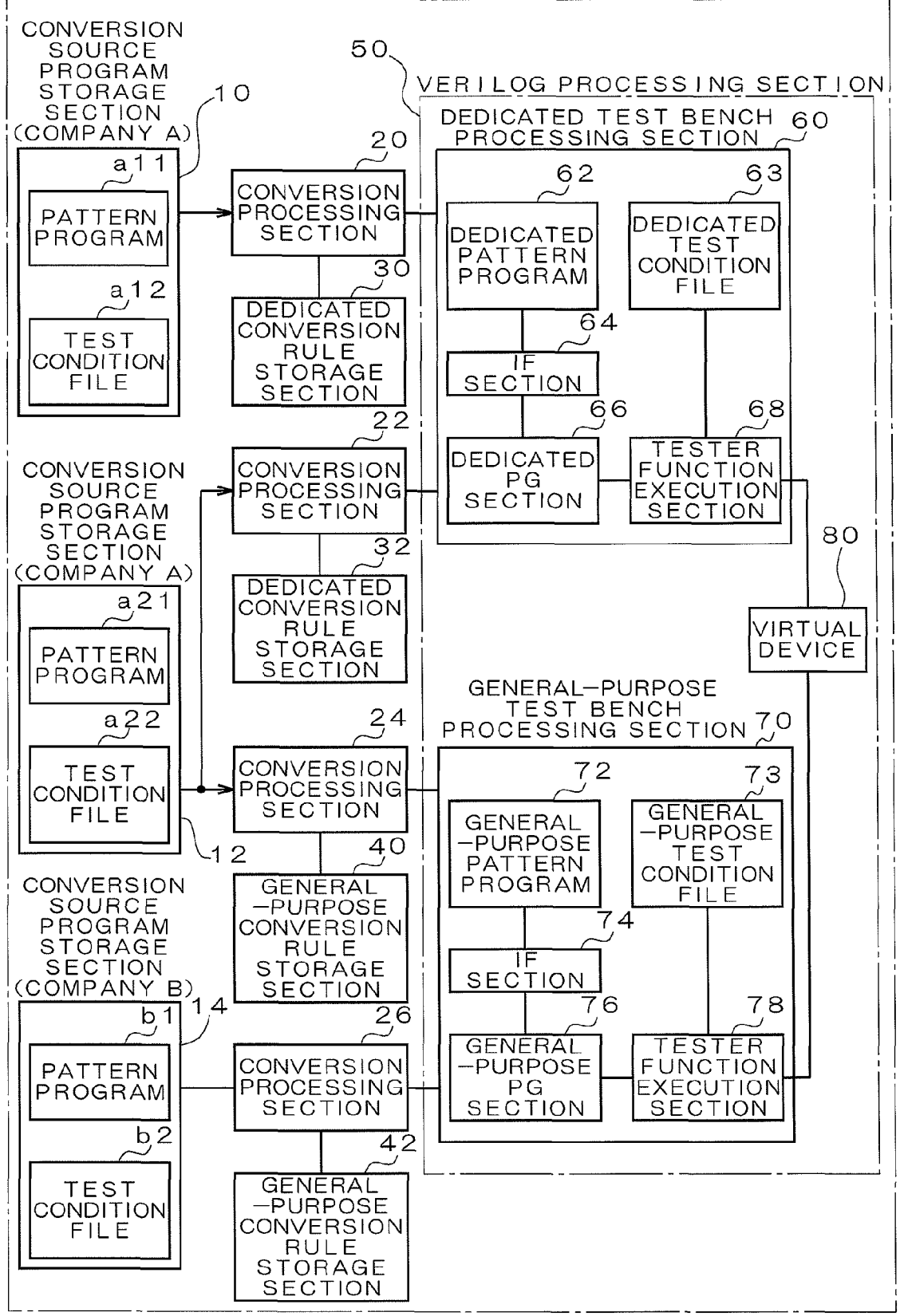
FIG. 1 is a view that shows a detailed configuration of a semiconductor test program debug device according to one embodiment.

DESCRIPTION OF SYMBOLS 10, 12, 14 Conversion source program storage sections
20, 22, 24, 26 Conversion processing sections
30, 32 Dedicated conversion rule storage sections
40, 42 General-purpose conversion rule storage sections
50 Verilog processing section
60 Dedicated test bench processing section
62 Dedicated pattern program
63 Dedicated test condition file
64, 74 IF (interface) sections
66 Dedicated PG (pattern generating) section
68, 78 Tester function execution sections
70 General-purpose test bench processing section
72 General-purpose pattern program
73 General-purpose test condition file
76 General-purpose PG section
80 Virtual device

BEST MODE FOR CARRYING OUT THE INVENTION

Figure 2:
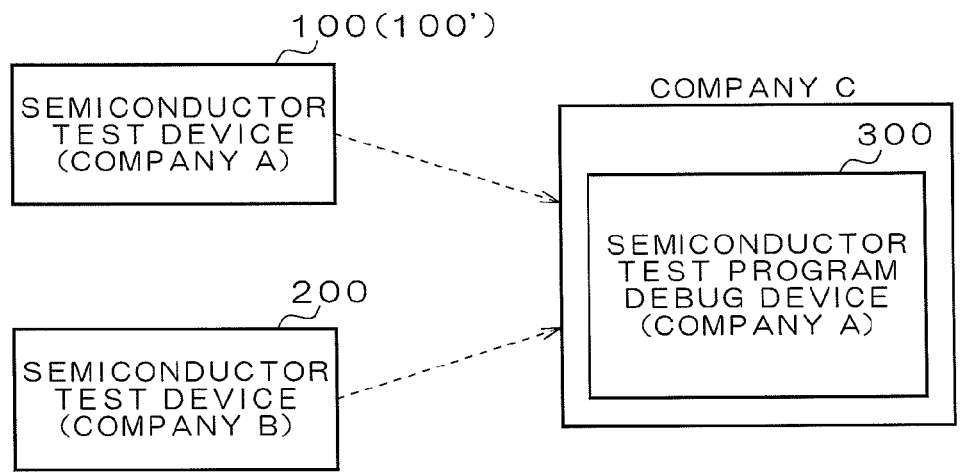
FIG. 2 is a view that illustrates the relation between a plurality of semiconductor test devices that have different specifications and a semiconductor test program debug device.

Hereunder, a semiconductor test program debug device according to one embodiment that applies the present invention is described in detail while referring to the drawings. FIG. 1 is a view that shows a detailed configuration of a semiconductor test program debug device according to one embodiment. FIG. 2 is a view that illustrates the relation between a plurality of semiconductor test devices that have different specifications and a semiconductor test program debug device.

As shown in FIG. 2, company C purchased a semiconductor test device 100 manufactured by company A and a semiconductor test device 200 manufactured by company B. Further, it is assumed that company C possesses a semiconductor test program debug device 300 that was developed by company A. In this connection, generally the semiconductor test program debug device 300 itself is implemented by executing a dedicated debug program that is developed by company A, using a general-purpose computer such as a workstation.

In this kind of case, conventionally, although the semiconductor test program debug device 300 developed by company A is capable of debugging a semiconductor test program to be used by the semiconductor test device 100 manufactured by company A, it has not been capable of debugging a semiconductor test program to be used by the semiconductor test device 200 of company B. This is because, a semiconductor test program is created with specifications and a program language that are unique to each manufacturer of semiconductor test devices, and since company A can not know the detailed specifications or program language contents of company B, company A can not interpret the contents of a semiconductor test program that is created in conformity with the specifications of company B and can not emulate the operations of the corresponding semiconductor test device 200. However, the semiconductor test program debug device 300 of the present embodiment is designed to be capable of debugging not only a semiconductor test program of company A, but also a semiconductor test program of company B.

As shown in FIG. 1, the semiconductor test program debug device 300 according to the present embodiment comprises conversion source program storage sections 10, 12 and 14, conversion processing sections 20, 22, 24 and 26, dedicated conversion rule storage sections 30 and 32, general-purpose conversion rule storage sections 40 and 42, and a Verilog processing section 50. The semiconductor test program debug device 300 is implemented using a computer such as a workstation that comprises a CPU (Central Processing Unit), a ROM (Read Only Memory), a RAM (Random Access Memory), a hard disk drive and the like, and performs a desired operation by executing a debug program installed in the hard disk drive using the CPU.

The conversion source program storage section 10 stores a test condition file a12 and a pattern program a11 as a semiconductor test program to be used with the semiconductor test device 100 of company A. The pattern program a11 specifies a generation pattern for a test signal when performing a test with respect to the device under test using the semiconductor test device 100. The test condition file a12 specifies test conditions such as a voltage level of a test signal.

Similarly, the conversion source program storage section 12 stores a test condition file a22 and a pattern program a21 as a semiconductor test program to be used with a semiconductor test device 100' of company A. Although the pattern program a11 and the test condition file a12 stored in the conversion source program storage section 10 and the pattern program a21 and the test condition file a22 stored in the conversion source program storage section 12 are made by company C in accordance with the specifications of the same company A, the model numbers or versions of the semiconductor test devices 100 and 100' that are the objects of the pattern programs and test condition files are different, and the respective pattern programs and test condition files are made on the basis of different specifications of company A.

The conversion source program storage section 14 stores a test condition file b2 and a pattern program b1 as a semiconductor test program that is used with the semiconductor test device 200 of company B. The pattern program b1 and the test condition file b2 are made by company C in accordance with the specifications of company B.

The conversion processing section 20 reads out the pattern program a11 and the test condition file a12 that are stored in the conversion source program storage section 10 and performs predetermined conversion processing based on dedicated conversion rules that are stored in the dedicated conversion rule storage section 30. Likewise, the conversion processing section 22 reads out the pattern program a21 and the test condition file a22 that are stored in the conversion source program storage section 12 and performs predetermined conversion processing based on dedicated conversion rules that are stored in the dedicated conversion rule storage section 32. The conversion processing section 24 reads out the pattern program a21 and the test condition file a22 that are stored in the conversion source program storage section 12 and performs predetermined conversion processing based on general-purpose conversion rules that are stored in the general-purpose conversion rule storage section 40. The conversion processing section 26 reads out the pattern program b1 and the test condition file b2 that are stored in the conversion source program storage section 14 and performs predetermined conversion processing based on general-purpose conversion rules that are stored in the general-purpose conversion rule storage section 42.

The Verilog processing section 50 is implemented using Verilog-HDL or VHDL as a hardware description language, and comprises a dedicated test bench processing section 60, a general-purpose test bench processing section 70, and a virtual device 80. The virtual device 80 simulates the operation of the device under test that is the object for actually performing a test using the semiconductor test devices 100 and 100', and can use data of a hardware description language that is created when designing the device under test.

The dedicated test bench processing section 60 executes a semiconductor test program using the semiconductor test devices 100 and 100' to emulate operations that conduct a test with respect to the device under test. The dedicated test bench processing section 60 comprises a dedicated pattern program 62, a dedicated test condition file 63, an IF section (interface section) 64, a dedicated PG (pattern generating) section 66, and a tester function execution section 68. The dedicated pattern program 62 corresponds to the pattern programs a11 and a21 that are stored in the conversion source program storage sections 10 and 12, and the program language to be used is converted. The dedicated test condition file 63 corresponds to test condition files a12 and a22 that are stored in the conversion source program storage sections 10 and 12, and the program language to be used is converted. As described above, the pattern programs a11 and a21 and the test condition files a12 and a22 are created with a unique program language of company A, and these are converted into the dedicated pattern program 62 and the dedicated test condition file 63 using Verilog-HDL or VHDL as a general-purpose hardware description language by the conversion processing sections 20 and 22. The IF section 64 interprets the contents of the dedicated pattern program 62 when executing the dedicated pattern program 62 and issues operating instructions to the dedicated PG section 66. The dedicated PG section 66 generates, in a pseudo manner, a test pattern that corresponds to the description contents of the dedicated pattern program 62. The tester function execution section 68 executes a virtual semiconductor test by emulating test operations with respect to the virtual device 80 based on a test pattern that is generated in a pseudo manner by the dedicated PG section 66 and test conditions that are specified by the dedicated test condition file 63.

The conversion processing section 20 creates the dedicated pattern program 62, the dedicated test condition file 63, the IF section 64, the dedicated PG section 66, and the tester function execution section 68 that are included in the dedicated test bench processing section 60 based on the pattern program a11 and the test condition file a12 that are stored in the conversion source program storage section 10 (in practice, a program described with Verilog-HDL of the like that implements each function of the dedicated test bench processing section 60 is created). Similarly, the conversion processing section 22 creates the dedicated pattern program 62, the dedicated test condition file 63, the IF section 64, the dedicated PG section 66, and the tester function execution section 68 that are included in the dedicated test bench processing section 60 based on the pattern program a21 and the test condition file a22 that are stored in the conversion source program storage section 12.

The conversion processing section 20 according to the present embodiment comprises not only a conversion operation function that creates the dedicated test bench processing section 60 based on the pattern program a11 and the test condition file a12, but also comprises an inverse conversion function that creates the pattern program a11 and the test condition file a12 based on dedicated conversion rules stored in the dedicated conversion rule storage section 30 and the contents (program described with Verilog-HDL or the like) of the dedicated test bench processing section 60 when a created dedicated test bench processing section 60 exists. Likewise, the conversion processing section 22 according to the present embodiment comprises not only a conversion operation function that creates the dedicated test bench processing section 60 based on the pattern program a21 and the test condition file a22, but also comprises an inverse conversion function that creates the pattern program a21 and the test condition file a22 based on dedicated conversion rules stored in the dedicated conversion rule storage section 32 and the contents of the dedicated test bench processing section 60 when a created dedicated test bench processing section 60 exists.

The general-purpose test bench processing section 70 emulates operations that conduct a test with respect to the device under test by executing a semiconductor test program using the semiconductor test device 200 or the semiconductor test device 100', and comprises a general-purpose pattern program 72, a general-purpose test condition file 73, an IF section (interface section) 74, a general-purpose PG (pattern generation) section 76, and a tester function execution section 78. The general-purpose pattern program 72 corresponds to the pattern programs a21 and b1 that are stored in the conversion source program storage sections 12 and 14, and the program language that is used is converted. The general-purpose test condition file 73 corresponds to the test condition files a22 and b2 that are stored in the conversion source program storage sections 12 and 14, and the program language that is used is converted. As described above, the pattern programs a21 and b1 and the test condition files a22 and b2 are created with a unique program language of company A or company B, and these are converted into the general-purpose pattern program 72 and the general-purpose test condition file 73 using Verilog-HDL or VHDL as a general-purpose hardware description language by the conversion processing sections 24 and 26. The IF section 74 interprets the contents of the general-purpose pattern program 72 when executing the general-purpose pattern program 72 and issues operating instructions to the general-purpose PG section 76. The general-purpose PG section 76 generates, in a pseudo manner, a test pattern that corresponds to the description contents of the general-purpose pattern program 72. The tester function execution section 78 implements a virtual semiconductor test by emulating test operations with respect to the virtual device 80 based on a test pattern that is generated in a pseudo manner by the general-purpose PG section 76 and test conditions that are specified by the general-purpose test condition file 73.

The conversion processing section 24 creates the general-purpose pattern program 72, the general-purpose test condition file 73, the IF section 74, the general-purpose PG section 76, and the tester function execution section 78 that are included in the general-purpose test bench processing section 70 based on the pattern program a21 and the test condition file a22 that are stored in the conversion source program storage section 12. Similarly, the conversion processing section 26 creates the general-purpose pattern program 72, the general-purpose test condition file 73, the IF section 74, the general-purpose PG section 76, and the tester function execution section 78 that are included in the general-purpose test bench processing section 70 based on the pattern program b1 and the test condition file b2 that are stored in the conversion source program storage section 14.

In this connection, the conversion processing section 24 according to the present embodiment comprises not only a conversion operation function that creates the general-purpose test bench processing section 70 based on the pattern program a21 and the test condition file a22, but also comprises an inverse conversion function that creates the pattern program a21 and the test condition file a22 based on general-purpose conversion rules that are stored in the general-purpose conversion rule storage section 40 and the contents (program described with Verilog-HDL or the like) of the general-purpose test bench processing section 70 when a created general-purpose test bench processing section 70 exists. Similarly, the conversion processing section 26 according to the present embodiment comprises not only a conversion operation function that creates the general-purpose test bench processing section 70 based on the pattern program b1 and the test condition file b2, but also comprises an inverse conversion function that creates the pattern program b1 and the test condition file b2 based on general-purpose conversion rules that are stored in the general-purpose conversion rule storage section 42 and the contents of the general-purpose test bench processing section 70 when a created general-purpose test bench processing section 70 exists.

The manner of distinguishing the use of the respective terms "dedicated" and "general purpose" in the aforementioned dedicated test bench processing section 60 and general-purpose test bench processing section 70 is as described hereunder. Since the overall debug program for implementing the semiconductor test program debug device 300 is created by company A, company A can create a test bench processing section that can faithfully emulate test operations by company A's own semiconductor test devices 100 and 100'. The dedicated test bench processing section 60 is a section that is created in this manner. This is the same as a conventional case of using a dedicated semiconductor test program debug device for the company's own semiconductor test program. The dedicated conversion rules stored in the dedicated conversion rule storage sections 30 and 32 for generating the dedicated test bench processing section 60 based on company A's own pattern program a11 or a21 or the test condition files a12 or a22 can be created by taking the detailed specifications into consideration. Accordingly, at the dedicated test bench processing section 60, the detailed test operations of the actual semiconductor test devices 100 and 100' can be emulated, and almost all the contents of the semiconductor test program can be debugged.

In contrast, the general-purpose test bench processing section 70 is a section for emulating test operations corresponding to a semiconductor test program made by company B. The detailed specifications of the semiconductor test device 200 or a semiconductor test program that is used therein of company B are not known by company A. Likewise, the detailed specifications of a semiconductor test device or a semiconductor test program made by company A are not known by company B. Accordingly, general-purpose conversion rules corresponding to general specifications excluding special specifications that are unique to company A or company B are stored in the general-purpose conversion rule storage sections 40 and 42, and the general-purpose test bench processing section 70 is created on the basis of these general-purpose conversion rules. In this connection, information that shows the relation between general-purpose conversion rules and general emulation operations that are performed by the general-purpose test bench processing section 70, more specifically, information for creating the general-purpose test bench processing section 70 with the conversion processing sections 24 and 26 using general-purpose conversion rules is openly available to each manufacturer of semiconductor test devices. Further, the general-purpose conversion rules inside the general-purpose conversion rule storage section 40 or the conversion processing section 24 (program for implementing the conversion processing section 24) corresponding to the pattern program a21 or the test condition file a22 of company A are created by company A. Likewise, the general-purpose conversion rules inside the general-purpose conversion rule storage section 42 or the conversion processing section 26 (program for implementing the conversion processing section 26) corresponding to the pattern program b1 or the test condition file b2 of company B are created by company B.

The above described dedicated test bench processing section 60 and the general-purpose test bench processing section 70 correspond to the test bench processing unit, the conversion source program storage sections 10, 12, and 14 correspond to the conversion source program storage unit, and the dedicated conversion rule storage sections 30 and 32 and the general-purpose conversion rule storage sections 40 and 42 correspond to the conversion rule storage unit, respectively.

Figure 3:
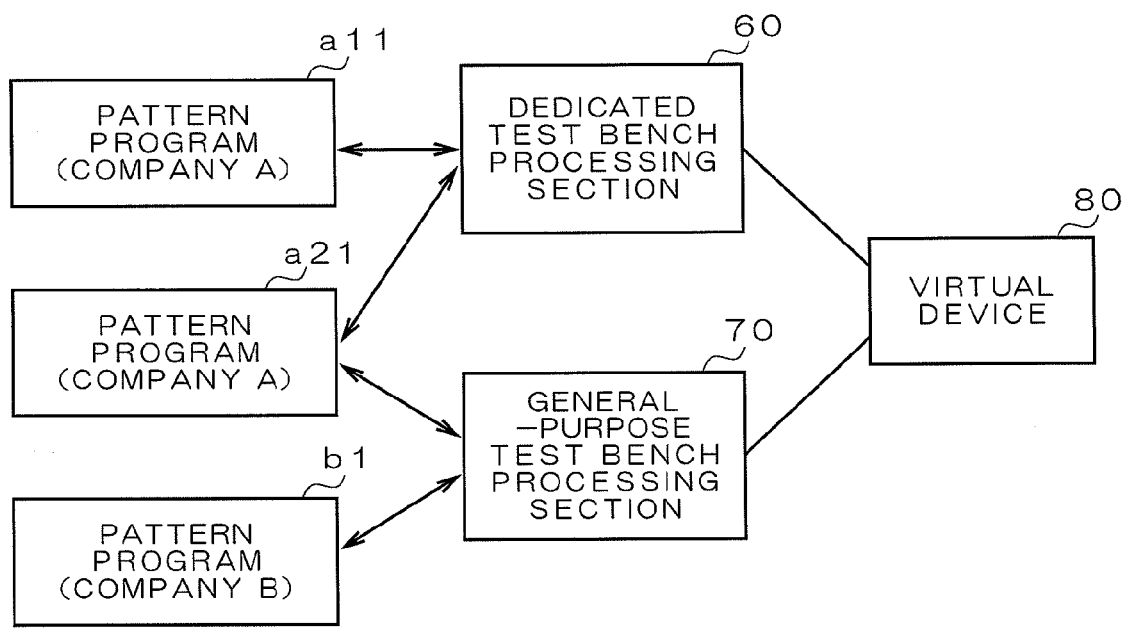
FIG. 3 is a view that illustrates the relation between pattern programs and test bench processing sections.

FIG. 3 is a view that illustrates the relation between pattern programs and test bench processing sections. As described above, the pattern program a11 that is created according to the specifications of company A is converted into the dedicated test bench processing section 60 by using the conversion processing section 20. Further, the pattern program a21 that is created according to different specifications of company A is converted into the dedicated test bench processing section 60 by using the conversion processing section 22. Thus, since two pattern programs a11 and a21 that have different specifications are converted into a common dedicated test bench processing section 60 by conversion processing sections 20 and 22 that correspond respectively to the pattern programs a11 and a21, debugging can be conducted with respect to these two pattern programs a11 and a21 that have different specifications by using one semiconductor test program debug device 300. Furthermore, by performing temporary conversion into the common dedicated test bench processing section 60, reciprocal conversion is enabled between the pattern program a11 and the pattern program a21 that are used in semiconductor test devices of mutually different model numbers or versions.

Likewise, the pattern program a21 that is created according to the specifications of company A is converted into the general-purpose test bench processing section 70 by using the conversion processing section 24. Further, the pattern program b1 that is created according to the specifications of company B is converted into the general-purpose test bench processing section 70 by using the conversion processing section 26. Thus, since two pattern programs a21 and b1 that have different specifications for company A and company B are converted into a common general-purpose test bench processing section 70 by conversion processing sections 24 and 26 that correspond respectively to the pattern programs a21 and b1, debugging can be conducted with respect to these two pattern programs a21 and b1 that have different specifications by using one semiconductor test program debug device 300. Furthermore, by performing temporary conversion into the common general-purpose test bench processing section 70, reciprocal conversion is enabled between the pattern program a21 corresponding to the specifications of company A and the pattern program b1 corresponding to the specifications of company B.

Thus, according to the semiconductor test program debug device 300 of the present embodiment, even when there are a plurality of semiconductor test programs and semiconductor test devices that have different specifications, it is possible to implement a virtual test (input and output operations for pseudo test signals and response signals) with respect to the virtual device 80 in conformity with the respective specifications. Further, since it is no longer necessary to provide a semiconductor test program debug device 300 for each kind of specification, unnecessary facilities can be reduced.

The virtual device 80 and the test bench processing sections 60 and 70 are implemented using the same hardware description language, more specifically, Verilog-HDL or VHDL. It is therefore possible to implement the functions of the virtual device and the test bench processing sections 60 and 70 using Verilog-HDL or VHDL as the hardware description language. In particular, although there are many cases in which a semiconductor test program has specifications that are unique to the manufacturer of the semiconductor test device, since the semiconductor test program can be converted into the test bench processing sections 60 and 70 that use a general-purpose hardware description language, a semiconductor test program debug device 300 can be implemented that has improved versatility and flexibility.

According to the present embodiment, debugging of a plurality of semiconductor test programs that have different specifications for respective manufacturers can be conducted with a common semiconductor test program debug device 300. Further, since general-purpose conversion rules that are stored in the general-purpose conversion rule storage sections 40 and 42 and the conversion processing sections 24 and 26 that correspond to the general-purpose conversion rule storage sections 40 and 42 are created by the manufacturers that correspond to the respective specifications, the general-purpose test bench processing section 70 that operates with the common semiconductor test program debug device 300 can be generated without disclosing detailed internal material of respective manufacturers with regard to each manufacturer of competing semiconductor test devices, and the common use of the semiconductor test program debug device 300 can be facilitated.

Further, even when there are a plurality of semiconductor test devices of different model numbers or versions that are produced by the same manufacturer and a plurality of semiconductor test programs that correspond to the respective semiconductor test devices, it is possible to perform debugging of these plurality of semiconductor test programs with a common semiconductor test program debug device 300.

Furthermore, reciprocal conversion of semiconductor test programs of different specifications is enabled through the test bench processing sections 60 and 70 that are created temporarily, specifications of semiconductor test programs of respectively different manufacturers or model numbers or versions or the like can be automatically changed, and in addition to effective utilization of semiconductor test programs, mistakes in specification changes due to manual operations can be prevented.

The present invention is not limited to the above described embodiment, and various modifications are possible without departing from the scope and spirit of the present invention. Although both the dedicated test bench processing section 60 and the general-purpose test bench processing section 70 are provided in the above described embodiment, a configuration may be adopted in which only one of these is provided. Further, although the dedicated test bench processing section 60 and the general-purpose test bench processing section 70 are implemented in the above embodiment using Verilog-HDL or VHDL as a hardware description language, a configuration may be adopted in which the dedicated test bench processing section 60 and the general-purpose test bench processing section 70 are implemented using C language or the like as another general-purpose language.

Industrial Applicability

According to the present invention, even when there is a plurality of semiconductor test programs or semiconductor test device that have different specifications, it is possible to implement a virtual test (input and output operations of pseudo test signals and response signals) with respect to a virtual device in conformity with the respective specifications, and since it is no longer necessary to provide a semiconductor test program debug device for each specification, unnecessary facilities can be reduced.

The invention claimed is:

1. A semiconductor test program debug device that conducts verification of a semiconductor test program by emulating operations of a semiconductor test device that conducts a test for a device under test based on the semiconductor test program, comprising:
a virtual device that simulates operations of the device under test;
a test bench processing unit that generates a pseudo test signal that corresponds to a test signal that is applied to the device under test and generates a response signal of the virtual device that corresponds to the pseudo test signal;
a conversion source program storage unit that stores each of a plurality of the semiconductor test programs that have different specifications;
a conversion rule storage unit that stores conversion rules that correspond to each of a plurality of specifications; and
a conversion processing unit that by converting the semiconductor test program that is stored in the conversion source program storage unit using the conversion rule that corresponds to specifications of the semiconductor test program stored in the conversion rule storage unit, generates the test bench processing unit that corresponds to the semiconductor test program.

2. The semiconductor test program debug device according to claim 1, wherein the semiconductor test program is a pattern program that specifies a generation pattern of the test signal that is applied to the device under test.

3. The semiconductor test program debug device according to claim 1, wherein the virtual device and the test bench processing unit are implemented by the same hardware description language.

4. The semiconductor test program debug device according to claim 3, wherein Verilog-HDL (Hardware Description Language) or VHDL (VHSIC(Very High Speed Integrated Circuits)Hardware Description Language) is used as the hardware description language.

5. The semiconductor test program debug device according to claim 1, wherein, when there is a plurality of semiconductor test devices that are manufactured by different manufacturers and a plurality of the semiconductor test programs that correspond to the respective semiconductor test devices, the plurality of specifications have contents that are set for each of the manufacturers.

6. The semiconductor test program debug device according to claim 5, wherein the conversion rules stored in the conversion rule storage unit and the conversion processing unit are created by a manufacturer corresponding to the respective specifications.

7. The semiconductor test program debug device according to claim 1, wherein, when there is a plurality of the semiconductor test devices of different model numbers or versions that are manufactured by the same manufacturer and a plurality of the semiconductor test programs that correspond to the respective semiconductor test devices, the plurality of specifications have contents that are set for each of the model numbers or versions.

8. The semiconductor test program debug device according to claim 1, wherein, when the test bench processing unit is specified, the conversion processing unit performs inverse conversion that generates the corresponding semiconductor test program based on the conversion rules.

* * * * *